United States Patent
Wu et al.

[11] Patent Number: 5,855,974
[45] Date of Patent: Jan. 5, 1999

[54] METHOD OF PRODUCING CVD DIAMOND COATED SCRIBING WHEELS

[75] Inventors: Ching-Hsong Wu, Farmington Hills; Timothy J. Potter, Dearborn, both of Mich.; Michael Alan Tamor, Toledo, Ohio; Richard Lawrence Allor, Livonia, Mich.

[73] Assignee: Ford Global Technologies, Inc., Dearborn, Mich.

[21] Appl. No.: 140,914

[22] Filed: Oct. 25, 1993

[51] Int. Cl.$^6$ ............................... B01J 19/10; B05D 3/06
[52] U.S. Cl. .................. 427/560; 427/577; 427/309; 427/249; 134/2
[58] Field of Search ................. 427/532, 577, 427/249, 309, 560; 134/2; 51/309

[56] References Cited

U.S. PATENT DOCUMENTS

| | | |
|---|---|---|
| 4,731,296 | 3/1988 | Kikuchi et al. . |
| 4,816,286 | 3/1989 | Hirose ........................ 427/577 |
| 4,884,476 | 12/1989 | Okuzumi et al. . |
| 5,082,359 | 1/1992 | Kirkpatrick et al. ............ 427/577 |
| 5,244,000 | 9/1993 | Stanford et al. ............... 134/2 |
| 5,308,661 | 5/1994 | Feng et al. .................. 427/249 |

FOREIGN PATENT DOCUMENTS

| | | |
|---|---|---|
| 61-159302 | 7/1986 | Japan . |
| 61-252004 | 11/1986 | Japan . |
| 63-099102 | 4/1988 | Japan . |

OTHER PUBLICATIONS

Morosanu, C.E., ed. Thin Films By Chemical Vapor Deposition Elsevier, pp. 370–372, 1990.

*Primary Examiner*—Roy V. King
*Attorney, Agent, or Firm*—Lorraine S. Melotik

[57] ABSTRACT

A method for providing a diamond film on a scribing wheel useful for scribing glassy materials in order to increase its wear resistance. The method comprises sequential steps which include pre-treating the surface of the scribing wheel and thereafter depositing the diamond film on the pretreated scribing wheel by a chemical vapor deposition process.

15 Claims, 2 Drawing Sheets

METHOD OF PRODUCING CVD DIAMOND COATED SCRIBING WHEELS

BACKGROUND OF THE INVENTION

This invention is generally directed to a method for providing a strongly adherent and durable polycrystalline diamond film on scribing wheels by chemical vapor deposition which includes pretreating the wheels.

Due to the need to produce various size and shapes of glass in different applications, glass cutting is an essential operation in glass manufacturing and processing. Because of the brittle nature of glass, the method and the tool used for glass cutting are quite different from those used for cutting other more plastic materials such as metal, metal alloys or metal composites. In cutting the latter, actual pealing or removal of materials during cutting is involved. Metal cutting tools have sharp cutting edges at the corners or tips of the tool bodies which remove or peal a portion of the metal surface. These types of tools, however, are not suitable to cut glass or other similar glassy materials like ceramics or silicon because those glass materials are brittle and susceptible to chipping and breaking if cutting is attempted with conventional, metal cutting tools.

The standard way of glass cutting is by scribing a line over the surface of glass and subsequently bending along the line to separate the object. The tools for scribing the line can be of any sharp pointed hard objects or, more commonly, a scribing wheels. When the sharp edge of the scribing wheel is pressed and rolled over the glass, it creates high compressive stress on the surface resulting in subsurface tensile cracking or tearing of the glass. A narrow crevice is formed underneath the score line as shown in FIG. 1. When a bending moment is applied to both sides of the crevice, a strong tension stress is developed at near the bottom of the crevice causing it to cleave and propagate downward and eventually separate the piece. In this case, little or no material is removed from glass during cutting, and because of the continuous change in the contact surface of the tool, its temperature remains relatively low (less than 150° C.).

Glass scribing wheels presently employed in the glass manufacturing industry are made of cobalt-cemented tungsten carbides (Co—WC). These wheels have reasonable hardness and wear resistance, but their useful lifetime is limited to a few hours of cutting. With use, severe wear occurs at the scribing edge around the circumference of the wheel so that it is necessary to frequently replace the wheel which results in substantial downtime and reduction in productivity.

Diamond is known to exhibit many excellent mechanical properties including superb hardness, low friction coefficient, high wear resistance, and high thermal conductivity which are ideal for making cutting tools. In fact, small diamond stones have been used for various cutting tools. However, the volume of consumption and associated costs of using pure natural diamond are prohibitive for industrial uses. Due to the recent advance in diamond synthesis, tools for cutting metals have been fabricated using such synthetic diamond. For example, metal cutting tools have been fabricated from sintered synthetic diamond powder, or by providing a diamond coating on the tool. U.S. Pat. No. 4,884,476 to Okuzumi, et al. discloses prefabricating thick diamond films and then bonding them onto the surface of a machining tool. The prefabrication of the diamond film and the fact that after applying the film to the tool it needs to be reground to proper tool shape make the process expensive. A more desirable way to apply a diamond coating to tools is by using chemical vapor deposition (CVD) techniques and diamond films have been applied to the surface of a drill, insert, or end mill used in the cutting using this technique.

In order to improve the adhesion between a diamond coating and the substrate, various techniques have been proposed. These include plasma ion etching, diamond powder scratching, and strong acid etching. The latter is exemplified in U.S. Pat. No. 4,731,296 to Kikuchi, et al. It discloses a method for improving the bond strength between a CVD applied diamond coating and a tungsten carbide-based material cutting tool for metals by subjecting the tungsten carbide tool to an aqueous solution of a strong acid such as nitric acid prior to providing the diamond coating. The acid removes cobalt present in the tungsten carbide as a binder from the surface region. The first two methods are unsuitable for use with Co—WC because they indiscriminately remove the tungsten carbide as well as the cobalt. The strong acid etching process is undesirable because it can cause excessive removal of the cobalt and damage the integrity of the bulk or the tool material in the surface region.

The method of the present invention provides a method of selectively and controllably removing undesirable materials, like oxides or cobalt, which may be present on the surface of the wheel and enhances the diamond nucleation of the CVD applied diamond film. Both of these aspects of the invention process contribute to the excellent diamond film adhesion and wear resistance of the present invention diamond coated scribing wheel.

SUMMARY OF THE INVENTION

The present invention is broadly directed to a method for providing a scribing wheel with a film of diamond and the wheel produced according to the method. The method comprises the steps of: providing a scribing wheel suitable to scribe glassy materials; subjecting the scribing wheel to a pretreatment process which comprises exposing the scribing wheel to: liquid cleaner; organic solvent; 5 to 30% hydrogen peroxide in water solution; and aqueous reducing solution comprising compounds selected from the group consisting of (i) KOH; (ii) a mixture of KOH and $K_3Fe(CN)_6$; (iii) NaOH; and (iv) a mixture of NaOH and $K_3Fe(CN)_6$; and subsequently depositing a film of diamond by a chemical vapor deposition process onto at least the scribing edge of the pretreated scribing wheel. The pretreatment can be implemented by carrying out the exposure to the hydrogen peroxide and the aqueous reducing solution in alternate order.

DETAILED DESCRIPTION OF THE PREFERRED EMBODIMENTS

Figure 1:
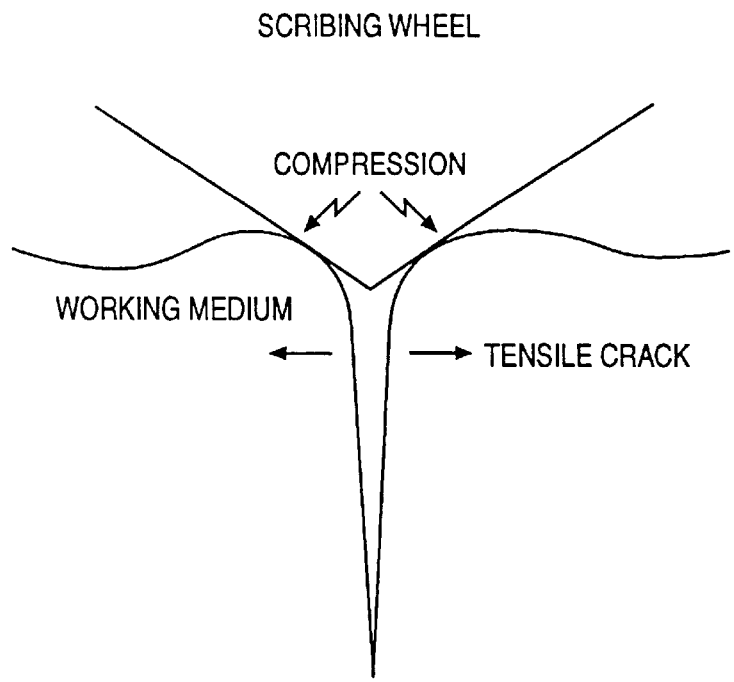
FIG. 1 is a schematic of a typical crevice created by a scribing wheel.

The method of the present invention is directed to providing an adherent, high quality film of diamond on a scribing wheel composed of material suitable to scribe glassy materials including glass, ceramics, silicon wafers, and the like, so as to improve the wear resistance and lifetime of the scribing wheel. Diamond coated scribing wheels provided with coatings according to the present invention have been shown to have an increased lifetime about 4–6 times that of the uncoated scribing wheels when used to scribe glass.

The scribing wheel provided according to the method of the present invention may be composed of any suitable material such as cobalt-cemented tungsten carbide, nano crystalline tungsten carbide having little or no cobalt binder and with or without molybdenum as a binder, silicon nitride, silicon carbide and boron carbide. Still other materials suitable useful as a scribing wheel for glassy materials according to the present invention would be apparent to those skilled in the art in view of the present disclosure. Preferably, in the case of Co—WC, the cobalt is present in an amount greater than about 2% by weight, more preferably greater than about 4% by weight, most preferably the cobalt is present in the Co—WC wheel material in a range between about 6 and 8% by weight. According to the present method, the scribing wheel is subjected to a pre-treatment process prior to application of the diamond film by chemical vapor deposition. The pretreatment process is necessary to prepare the surface so that the diamond film will be adherent and of high quality. In particular, such preparation has been found to foster diamond nucleation during the CVD step.

The pretreatment involves first exposing the scribing wheel to a liquid cleaner, generally a detergent like LIQUI-NOX (tradename, Alconox), generally in a 1–5% aqueous solution and preferably in an ultrasonic bath. The wheel is exposed to the cleaner for a period of time to clean the surface of the scribing wheel of general contaminants, optimally being about 10–30 minutes. The scribing wheel is then exposed to an organic solvent such as acetone, methanol, ethanol or hexane, more preferably by means of an ultrasonic bath. This exposure is for a period of time to substantially remove other impurities as well as the liquid cleaner, optimally being about 10–30 minutes. As would be apparent to those skilled the art in view of this disclosure, the time of exposure to the cleaner and solvent will depend on such factors as concentration of the solution, level and type of contaminants, and whether an ultrasonic bath is employed.

The scribing wheel is further pretreated by exposing the scribing wheel, which has already been subject to the pretreatments discussed above, to a solution of hydrogen peroxide in water, preferably being deionized water. The concentration of the hydrogen peroxide is from 5 to 30% in the water. The pretreatment process for the scribing wheel also involves exposing the scribing wheel to an aqueous reducing solution which removes any surface oxides which may be exist on the scribing wheel. It is believed that these pretreatment steps remove undesirable materials from on and near the surface including contaminants such as oxides and binder materials such as cobalt (in Co—WC) or a material such as iron which may be present as an impurity in a wheel material like silicon nitride, from near the surface without damaging the bulk of the scribing wheel material. Such oxides and cobalt or other materials like iron, if present on or near the surface of the wheel, are found to interfere with the nucleation and adherence of the diamond film to the scribing wheel. According to the present invention method, when the scribing wheel comprises a binder, the materials removed by exposure to the hydrogen peroxide solution and reducing solutions are preferably removed to a depth equal to between about 25% and 55% of the average particle size (diameter) of the bulk material of the scribing wheel. Generally the optional average particle size is between about 0.5 and 2 microns, preferably being less than 1 micron. The upper limit (55%) is optimal to allow the diamond film to be grown on a surface free of undesirable surface materials like contaminants and binder while the lower limit (25%) is optimal to maintain the integrity of the substrate.

Figure 2A:
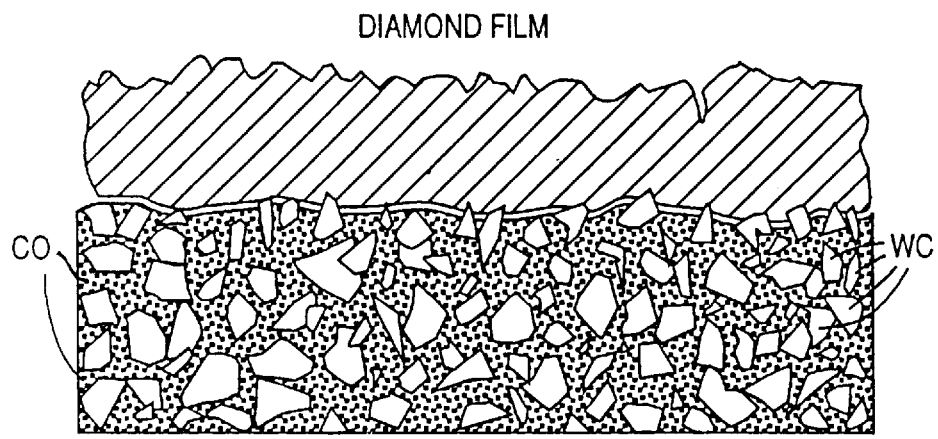
FIGS. 2A and 2B are schematics depicting the different results when etching with a strong acid versus pretreatment according to the present invention.
Figure 2B:
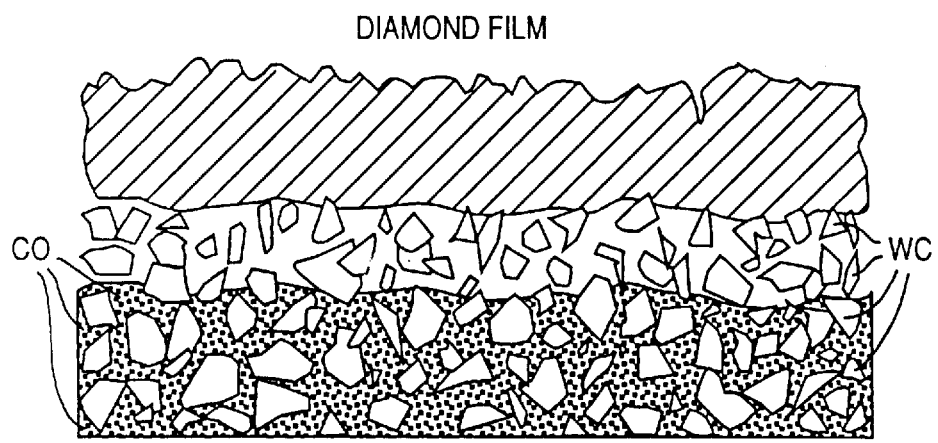

In the preferred embodiment of the present invention, the scribing wheel is cobalt cemented tungsten carbide (Co—WC), the diamond films that are grown will be present on the top of the upper layer of WC particles, which are well bonded to the bulk of the Co—WC by the underside Co as depicted in FIG. 2A. In comparison, diamond films provided on a Co—WC substrate from which too much cobalt has been removed as by etching by a strong acid, as shown in FIG. 2B, are subject to delamination by spalling within the etched region of the tool body because its integrity has been excessively compromised in this region.

According to the present invention method, the order of exposing the scribing wheel to the hydrogen peroxide solution and the aqueous reducing solution is not critical. That is, the exposure to the hydrogen peroxide solution can be carried out first followed by exposure to the aqueous reducing solution or visa-versa. The aqueous reducing solution comprises compounds selected from the group consisting of: potassium hydroxide (KOH); a mixture of KOH and $K_3Fe(CN)_6$ known as Murakami reagent solution; sodium hydroxide (NaOH); and a mixture NaOH and $K_3Fe(CN)_6$. Generally, the concentration of these compounds in the aqueous solution is from about 5 to about 15 percent by weight, more preferably, between about 5 and about 10 weight percent. Preferably the aqueous reducing solution is contacted with the scribing wheel in an ultrasonic bath.

The pretreatment process steps may be carried out at room temperature but it is preferred that they be carried out at an elevated temperature, generally at a temperature preferably between 25° C. and about 50° C. The time of exposure for the wheel to the various materials, like the peroxide solution, during the pretreatment can vary. Optimal times is 1 to 30 minutes for each step but the time will be dependent on such factors as temperature of the solution, the type of component being leached out of the wheel, the concentration of the component material in the wheel, and the surface roughness of the wheel (a rougher surfaces allowing faster leaching of the material). For example, a 30% hydrogen peroxide solution if employed at room temperature (25° C.) would be allowed to contact the wheel generally for 2–10 minutes. The aqueous reducing solutions, if employed at room temperature, the wheel is generally exposed for a period of about 2–10 minutes.

A diamond film is subsequently deposited on the pretreated scribing wheel by chemical vapor deposition (CVD) techniques. The pretreatment as described above enhances diamond nucleation and adhesion of the film to the scribing wheel. The CVD process optimally would be carried out shortly after the pretreatment process, especially in the case of Co—WC wheels before the cobalt has sufficient time to migrate from the bulk to the surface. The cobalt ultimately migrates to the surface and desirably aids in maintaining the integrity of the Co—WC near the surface of the wheel.

The diamond coating can be deposited by any of a number of CVD techniques, such as hot-filament, microwave (MW) plasma, radio frequency (RF) plasma, direct current (DC) plasma, DC arc, oxygen-acetylene combination torch, and plasma, DC and RF or MW jet techniques, all of which are well-known to those skilled in the art. There are still other CVD techniques suitable for applying the diamond film on the scribing wheel after pretreatment according to this invention as would be apparent to those skilled in the art in view of the present disclosure. The diamond film needs to be applied at least onto the scribing edge of the scribing wheel, but may be applied over a larger area. Coating only the edges of the wheels is preferable because it provides a diamond film in the needed circumferential scribing area and eliminates unnecessary expense generated by coating more of the scribing wheel. To more efficiently deposit the diamond film on only the scribing edge of the wheels, they could be stacked on a rod which may be rotated slowly during the chemical vapor deposition to assure uniform coating of the exposed edges.

Figure 3:
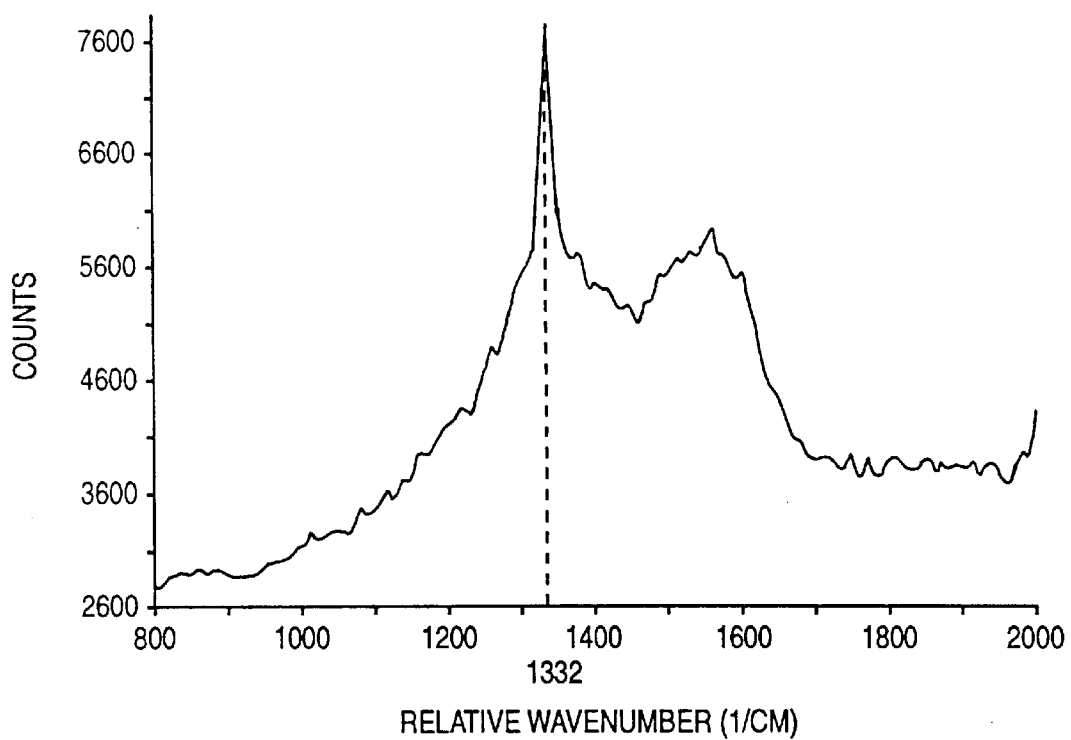
FIG. 3 is a Raman spectrum indicating the high purity of a diamond film on a scribing wheel according to the present invention.

According to one conventional CVD technique, the diamond coating conditions generally involve placing the wheels flat on either graphite or silicon surfaces and exposing the wheels to a diamond forming atmosphere. This generally comprises maintaining a pressure of about 20–80 Torr., of a gas composition comprising 0.2–10 volume percent methane and hydrogen at a total flow rate of about 20–1000 standard cubic centimeters per minutes (sccm). As would be apparent to those skilled in the art, the gas composition in CVD diamond film deposition often comprises other materials such as acetylene, acetone, aldehyde, and carbon monoxide, as well as halogen containing compounds such as $CF_4$, $CCl_4$, and $CH_2Cl_2$. According to an exemplary process, the wheels are placed in a microwave CVD reactor for diamond coating and the microwave power is kept between about 0.5–1.5 kW. During the CVD process, the temperature of the wheels is preferably maintained between about 800°–1050° C. According to this exemplary process, deposition time was varied between about 1–10 hours, typically being 4 hours, and produced a film thickness of about 0.5–10 $\mu$m, typically being about 3 $\mu$m. A number of diamond films produced in this manner according to the present invention were characterized with RAMAN spectrometry and scanning electron microscopy (SEM). A strong diamond peak at 1332 $cm^{-1}$ was observed in the Raman spectrum of such films, one of which is shown in FIG. 3, indicating the high purity of the diamond film deposited on the scribing wheels. Particularly outstanding polycrystalline diamond quality was associated with such films deposited in a thickness of 0.5 to 4 $\mu$m.

Preferably, in providing the CVD diamond film on the pretreated scribing wheel, a two step diamond deposition process is used wherein the first step comprises diamond nucleation and the second diamond growth. Optionally, during the first step, the wheel temperature is kept low (700–900 C.) and the amount of the methane is kept high at 2 to 8 volume percent in the hydrogen feed gas for 2 to 10 minutes at a pressure of 40 Torr. Optimally, after the nucleation period, the diamond deposition is conducted at higher wheel temperatures (800–1000 C.) and lower methane concentrations (0.2–2%) at a constant pressure (20–80 Torr). The growth rate is typically at 0.5 to 2.5 $\mu$m/hour. The deposition time is varied from 1 to 10 hours for coating diamond films with thicknesses or 0.5 to 10 $\mu$m.

The wheels made according to this invention were evaluated in a glass production plant for scribing thick glass plates (0.1–0.15 inches) with a scribing speed of 95 feet/minute. The results showed that the lifetime of the diamond-coated scribing wheels was increased 4–6 times as compared to the uncoated ones. In addition, the scribing wheels were shown to produce smooth edges on the score lines.

While this invention has been described with respect to scribing wheels for cutting glass, as would be apparent to one skilled in the art in view of this disclosure, its uses are very broad. For example, the scribing wheel can be used in the clean separation of many other materials including, e.g., the dicing of silicon wafers for microelectronics chips manufacturing, the precision scribing of Liquid Crystal Displays (LCD) windows, and the splitting of alumina and other glassy materials.

We claim:

1. A method for producing a film of polycrystalline diamond by chemical vapor deposition on a scribing wheel having a scribing edge, which method comprises the steps of:

(a) providing a scribing wheel suitable to scribe silicon, ceramic, or class materials;

(b) exposing said scribing wheel to liquid cleaner and subsequently organic solvent;

(c) exposing said scribing wheel to a 5–30% by weight hydrogen peroxide in water solution;

(d) exposing said scribing wheel to an aqueous reducing solution consisting of compounds selected from the group consisting of: (i) KOH; (ii) a mixture of KOH and $K_3Fe(CN)_6$; (iii) NaOH; and (iv) a mixture of NaOH and $K_3Fe(CN)_6$; and (e) depositing a film of polycrystalline diamond by a chemical vapor deposition process onto at least the scribing edge of said scribing wheel, wherein steps (c) and (d) are carried out in alternate order.

2. The method according to claim 1, wherein said scribing wheel is composed of a material selected from the group consisting of tungsten carbide, tungsten carbide containing cobalt, silicon nitride, silicon carbide, and boron carbide.

3. The method according to claim 1, wherein said liquid cleaner is a detergent.

4. The method according to claim 1, wherein said organic solvent is selected from the group consisting of acetone, methanol, ethanol, and hexane.

5. The method according to claim 1, wherein the water is deionized water.

6. The method according to claim 1, wherein said scribing wheel is exposed to said hydrogen peroxide solution in an ultrasonic bath for a time of between about 1 and about 30 minutes at a temperature of between about 25° C. and 50° C.

7. The method according to claim 1, wherein said scribing wheel is exposed to said reducing solution in an ultrasonic bath for a time of between about 1 and about 30 minutes at a temperature of between about 25° C. and 50° C.

8. The method according to claim 1, wherein said chemical vapor deposition technique is selected from hot-filament, microwave plasma, radio frequency plasma, DC arc, DC plasma, oxygen-acetylene combination torch, and plasma, DC, radio frequency or microwave jet techniques.

9. The method according to claim 1, wherein said chemical vapor deposition involves reactions of materials selected from the group consisting of acetylene, acetone, aldehyde, carbon monoxide, and halogen containing compound in a hydrogen feed gas.

10. The method according to claim 1, wherein said film of diamond has a thickness of 0.5 to 10 $\mu$m.

11. The method according to claim 1, wherein said chemical vapor deposition process comprises two steps, the first step comprising maintaining the wheel at a temperature between about 700°–900° C. and the amount of the methane at 2 to 8 volume percent in a hydrogen feed gas for 2 to 10 minutes at a pressure of 40 Torr; and the second step comprises maintaining the wheel at a temperature between about 800°–1000° C. and the amount of methane at 0.2 to 2 volume percent in a hydrogen feed gas at a substantially constant pressure between about 20 and 80 Torr.

12. A method of producing a film of polycrystalline diamond by a chemical vapor deposition on a scribing wheel having a scribing edge, which method comprises the steps of:

(a) providing a scribing wheel of cobalt cemented tungsten carbide suitable to scribe a silicon, ceramic, or glass material;

(b) exposing said scribing wheel to liquid cleaner and subsequently organic solvent;

(c) exposing said scribing wheel to a 5–30% by weight hydrogen peroxide in water solution for a time between about 1 and 60 minutes at a temperature of between about 25° and 50° C.;

(d) exposing said scribing wheel to an aqueous reducing solution consisting of compounds selected from the group consisting of: (i) KOH; (ii) a mixture of KOH and $K_3Fe(CN)_6$; (iii) NaOH; and (iv) a mixture of NaOH and $K_3Fe(CN)_6$ for a time between about 1 and 30 minutes at a temperature of between about 25° and 50° C.; and (e) depositing a film of diamond in a thickness between about 0.5 and 10 $\mu$m by a chemical vapor deposition process onto at least the scribing edge of said scribing wheel, where said steps (c) and (d) are carried out in alternate order.

13. The method according to claim 12, wherein said wheel comprises greater than about 2% by weight cobalt.

14. The method according to claim 13, wherein said wheel comprises greater than about 4% by weight cobalt.

15. The method according to claim 12, wherein said steps (c) and (d) etch cobalt out of the surface of said scribing wheel to a depth of between about 25% and 55% of the average particle size of tungsten carbide particles.

* * * * *